(12) United States Patent
Huang et al.

(10) Patent No.: US 6,960,554 B2
(45) Date of Patent: Nov. 1, 2005

(54) METHOD OF MAKING A BSCCO SUPERCONDUCTOR ARTICLE

(75) Inventors: Yibing Huang, Northborough, MA (US); Gilbert N. Riley, Jr., Marlboro, MA (US); Noe DeMedeiros, Attleboro, MA (US)

(73) Assignee: American Superconductor Corporation, Westborough, MA (US)

( * ) Notice: Subject to any disclaimer, the term of this patent is extended or adjusted under 35 U.S.C. 154(b) by 182 days.

(21) Appl. No.: 10/133,107

(22) Filed: Apr. 26, 2002

(65) Prior Publication Data

US 2003/0062659 A1 Apr. 3, 2003

Related U.S. Application Data

(60) Provisional application No. 60/286,944, filed on Apr. 27, 2001.

(51) Int. Cl.[7] .......................... H01L 39/24; C04B 33/32
(52) U.S. Cl. .................. 505/430; 505/450; 264/620; 264/658
(58) Field of Search ................. 264/620, 658; 505/430, 450

(56) References Cited

U.S. PATENT DOCUMENTS

| | | | |
|---|---|---|---|
| 5,635,456 A | 6/1997 | Riley, Jr. et al. | 505/501 |
| 5,798,318 A * | 8/1998 | Li et al. | 505/501 |
| 5,942,466 A | 8/1999 | Li et al. | 505/431 |
| 6,069,116 A * | 5/2000 | Li et al. | 505/431 |
| 6,247,224 B1 | 6/2001 | Li et al. | 29/599 |
| 6,481,091 B2 * | 11/2002 | Wu | 29/599 |

* cited by examiner

*Primary Examiner*—Christopher A. Fiorilla
(74) *Attorney, Agent, or Firm*—Wilmer Cutler Pickering Hale and Dorr LLP

(57) ABSTRACT

A method of making an oxide superconductor article includes converting an oxide superconducting precursor into an oxide superconductor by thermo-mechanical processing using intermediate rolling deformation and heat treatment (including liquid-phase sintering and low temperature baking) and applying an additional heat treatment after the material is fully processed (including optional liquid-phase sintering and low temperature baking) to decompose any secondary phase remaining at the grain boundaries and to promote diffusion of the secondary phase into the oxide grain, where they form 2223 phase. The material has a better superconducting grain connectivity and improved superconducting transport property.

21 Claims, 2 Drawing Sheets

METHOD OF MAKING A BSCCO SUPERCONDUCTOR ARTICLE

This application claims benefit of provisional application No. 60/286,944 filed Apr. 27, 2001.

BACKGROUND OF THE INVENTION

This invention relates to processing of oxide superconductor composites to obtain strong grain coupling and high critical current density oxide superconductor articles.

Polycrystalline, randomly oriented oxide superconductor materials are generally characterized by their low density, poor grain connection and low critical current densities. High oxide density, good oxide grain alignment and grain interconnectivity, however, are associated with superior superconducting properties.

Composites of superconducting materials and metals are often used to obtain better mechanical properties than superconducting materials alone provide. These composites may be prepared in elongated forms such as wires and tapes by a well-known powder-in-tube or PIT method. When powders include metal oxides or other oxidized metal salts, the method is referred to as oxide-powder-in-tube or OPIT. For filamentary articles, the method generally includes the three stages of (a) forming a powder of superconducting precursor materials (precursor powder formation stage); (b) filling a noble metal billet with the precursor powder, longitudinally deforming and annealing it, forming a bundle of billets or of previously formed bundles for multifilamentary forms, and longitudinally deforming and annealing the bundle to provide a composite of reduced cross-section including one or more filaments of superconductor precursor material surrounded by a noble metal matrix (composite forming stage); and (c) subjecting the composite to successive asymmetric deformation and annealing cycles and further thermally processing the composite to form and sinter a core material having the desired superconducting properties (thermo-mechanical processing stage). General information about the OPIT method described above and processing of the oxide superconductors is provided by Sandhage et al. in *JOM*, 43(3):21–25 (1991), and references cited therein; by Tenbrink et al., "Development of Technical High-Tc Superconductor Wires and Tapes," Paper MF-1, Applied Superconductivity Conference, Chicago (Aug. 23–28, 1992); and by Motowidlo et al., "Properties of BSCCO Multifilamentary Tape Conductors," Materials Research Society Meeting, Apr. 12–15, 1993, all of which are incorporated by reference.

The deformations of the thermo-mechanical processing state are asymmetric deformations, such as rolling and pressing, which create alignment of precursor grains in the core (textured grains) and facilitate the growth of well-aligned and sintered grains of the desired oxide superconducting material during the later thermal processing stages. A series of heat treatments is typically performed during the thermo-mechanical processing stage to convert the partially reacted oxide powder to $Bi_2Sr_2Ca_2Cu_3O_x$(BSCCO-2223 or 2223) superconducting phase, where x is selected to provide superconductivity at temperatures above 77K, in order to crystallize the desired highly textured superconducting layer and to obtain strongly coupled superconducting grains.

In the practice of the above prior art approach, it has been found that in the final thermo-mechanical processing stage, some low Tc superconducting phases, such as BSCCO-2212 (2212) and BSCCO-2201 (2201), and non-superconducting phases, such as $Ca_2PbO_4$ and (B,P)SCCO-3221 (3221), may remain or reform during the cooling stage, as observed by Poulsen et al. using a synchrotron X-ray diffraction method (*Physica C* 298:265 (1998)). These phases may stay at grain boundary and reduce grain coupling, which is one of the most effective factors limiting superconducting transport property. See, Kaneko et al. *Advances in Superconductivity IX. Proceeding of the 9th International Symposium on Superconductivity:* 907 (1997).

Current approaches to improving grain connectivity include treating the material at reduced temperatures after liquid-phase sintering. For example, Li et al. in U.S. Pat. No. 5,798,318, report processing a BSCCO material by liquid-phase sintering at 820–840° C., immediately followed by heat treatment at 750–830° C. to fully convert the liquid phase and remaining 2212 and 2201 phases into 2223 phase and then at 600–750° C. to reduce lead-rich phases, such as $Ca_2PbO_4$ and 3221, at the grain boundaries. Liu et al. (*Physica C* 325:70 (1999)) reported that the remaining 2212 and liquid phases convert to 2223 phase and that superconducting transport performance is significantly improved by sintering at 840° C. followed by annealing at about 825° C. Zeimetz et al. (*Superconductor Science and Technology* 11:505 (1998)) disclose a heat treatment at 820° C. (50 h) after 2223 phase formation, which reduces the 2201 phase at the grain boundary. Recently, Hua et al. (*Physica C* 339:181 (2000)) also reported that annealing at 780° C. after a phase converting heat treatment (herein after "post-annealing") increases the Tc of the remaining 2212 phase and improves transport property. Another example of post-annealing to reduce the amount of lead-rich and 2201 phases includes cooling to room temperature between liquid phase sintering at 839° C. (50 h) and post-annealing at 819° C. (100 h) (Lehndorff et al., *Physica C* 312:105 (1999)). This treatment significantly reduces 2201 and 3221 phase, and increases 2223 and 2212 phases as well.

These approaches represent attempts to improve grain connectivity by baking or annealing at reduced temperature after liquid phase sintering. The remaining liquid phase and 2212 and 2201 phases, as well as lead-rich phases such as $Ca_2PbO_4$ and 3221 phases that are formed during the cooling stage, are removed to some extent by this type of post-annealing.

A different approach to improving oxide phase formation and oxide grain connectivity is to control the cooling rate after liquid phase sintering. Many groups have studied the cooling rate effect on transport property; however, no consistent results are reported because the starting materials for these studies had different phase compositions. Huang et al. (*Superconductor Science and Technology* 7:795 (1994)) identifies 50° C./h as an optimal cooling rate because fast cooling causes less 2223 phase decomposition. Singh et al. (*Journal of Materials Research* 13:261 (1998)) report that cooling at 5° C./h produces higher phase purity in some tapes above 700 C., but that below 700° C. slow cooling leads to 2223 phase instability.

Most experiments described above were carried out on short tapes, which are not always predictive of performance in long lengths of material. For example, oxygen diffusion through matrix material is not as critical an issue in short lengths as it is in long lengths of tape. Because lead-rich phase formation relates to oxygen absorption, slower oxygen diffusion rate through the matrix in long tapes delays a lead-rich phase formation, and the lead-rich phase remains at the grain boundary when forming at lower temperature.

Thus, there remains a need to further improve grain connectivity by increasing phase purity and reducing lead-rich phases as well as other secondary phases at grain boundary, especially for long length material.

SUMMARY OF THE INVENTION

Although BSCCO 2223 material of the prior art can be made with high phase purity, it also has lead-rich phase impurities at the grain boundaries. See, U.S. Pat. No. 5,798, 318. The present invention retains or increases 2223 oxide superconductor phase purity in a process that converts the remaining secondary phases to 2223 phase, reduces lead content in the 2223 grains before cooling, enhances diffusion of lead-rich and other secondary phases into voids of the superconductor core, and reduces secondary phases at grain boundaries. This process presents great advantages over the prior art processes in that better grain connectivity and higher superconducting transport property are obtained.

The present invention overcomes the limitations of the prior art by introducing an additional heat treatment (AHT) after the final phase converting heat treatment (FHT) that forms the oxide superconductor and provides initial oxide grain connectivity. The additional heat treatment is selected to decompose any secondary phase remaining inside grain or at the grain boundaries and to promote diffusion of the secondary phases into the void space between the oxide grains.

Materials processed according to the invention exhibit improved grain connectivity and superconducting transport properties. In addition, critical current density under self-field and applied field (e.g. 0.1T) increases by 5–30% (as compared to samples similarly processed, but without AHT). There is no detrimental effect on the high 2223-phase purity.

Good grain connectivity includes the following characteristics. There is very little secondary phase impurity at grain boundaries between superconducting 2223 grains. The presence or absence of secondary phase is determined locally by observation under high magnification. "Little" secondary phase impurity is that which is not visible at high magnification, ~15000×, in the Scanning Electron Microscope (SEM). Good grain connectivity also includes small misalignment angle (<15°) of the oxide grains. In addition, the composition of the superconducting material at the grain boundary has the correct 2223 chemical composition and only ~60% of critical current drop when applying 0.1T magnetic field in tape normal direction.

By good superconducting transport property, i.e. high critical current density (Jc) is meant that under self or applied field the material can carry large amount of current per unit of cross-section area without loss of superconductivity (critical current density). The critical current density is preferably higher than 30,000 A/cm$^2$ (77K).

By high 2223-phase purity is meant that the 2223 phase is the majority phase as observed by standard x-ray diffraction (XRD) techniques. Other phases only have a very weak diffraction intensity comparing to that from 2223 phase, and are present at levels below 10%.

In one aspect of the invention, a method of making an oxide superconductor article is provided including subjecting an oxide superconductor precursor to a texturing operation to orient grains of the oxide superconductor precursor to obtain a highly textured precursor; and converting the textured oxide superconducting precursor into an oxide superconductor using conventional thermo-mechanical processing. After the final phase converting heat treatment, the material has high purity 2223 phase, relatively low lead content in the 2223 grain, many intergrowth phases, e.g. 2212 and 2234 and a substantial amount of lead-rich phase in the porous regions, e.g., crack, hole or intergranular regions, of the material. An additional heat treatment (AHT) is then applied, during which the remaining secondary phases inside the oxide grains, such as 2212 and 2234 intergrowth, or at the grain boundaries, such as 2212, 2201 and lead-rich phases, decompose and convert to 2223 phase or diffuse into the 2223 grains again. In at least some embodiments, the article is cooled at a set cooling rate (controlled cooling) after AHT processing. After controlled cooling, there is less secondary phases at the grain boundary, and less lead-rich phase formation (or lead-rich phase formation may finish at higher temperature). Therefore, the grain connectivity and the critical current density are significantly improved.

In at least some embodiments, the oxide superconductor is preliminarily obtained using a final phase converting heat treatment as described in U.S. Pat. Nos. 5,635,456 and 5,798,318. By way of example, the process includes liquid-phase sintering (i.e., ca. 810–850° C.), and then heating in a two-stage operation at temperatures lower than the liquid-phase sintering temperature (i.e., ca. 750–830° C. and ca. 600–750° C.), and then cooling to below about 400–600° C. (from the higher temperatures of the 2223-forming heat treatment) at a controlled rate of about 10–100° C./h.

In at least some embodiments, the additional heat treatment (AHT) of the invention includes heating the material at a temperature in the range of about 600° C. to about 830° C. under conditions selected to decompose remaining secondary phases at the oxide superconducting grain boundary or within the oxide superconductor grain and to convert the secondary phases into the BSCCO 2223 oxide superconducting phase. In at least some embodiments, the additional heat treatment includes heating to about 750–830° C. and annealing the material again in a two-stage heat treatment of, first, about 750–830° C. and, second, about 600–750° C., and then slow cooling to room temperature. In at least some embodiments, the article is cooled after AHT to about 400–600° C. at a controlled cooling rate of about 10–200° C./h.

In some embodiments, the secondary phases remaining inside the 2223 grains, such as 2212 and 2234 inter-growth phases, are significantly reduced after AHT by converting to 2223 phase.

In some embodiments, the lead-rich phases diffuse into porous regions of material during the AHT, leaving the grain boundaries clean after the AHT. In other embodiments, the lead content of the 2223 phase before cooling and after AHT is lower than that in final phase converting heat treatment before cooling and after annealing. In still other embodiments, the critical current density after AHT is >5% higher than that of the material after final phase converting heat treatment.

In at least some embodiments, there is no intermediate deformation between the final (phase converting) and the additional heat treatments. There are very small dimension (<5%) and texture (<2%) change of the final article before and after AHT processing.

In at least some embodiments, the additional heat treatment includes sintering at liquid phase temperature for a short period followed by baking at one or two temperatures lower than the liquid sintering temperature during the additional heat treatment. In at least some other embodiments, the AHT includes baking at one or two temperatures lower than the liquid sintering temperature. In either case, the 2223 phase purity of the article remains at a similar level (<5% change) before and after AHT.

In some embodiments, the AHT heating rate for reaching baking temperature is in the range of 20–600° C./h. In some embodiments, the AHT is a two-step process and the first baking temperature is in the range of about 750–830° C. and the second baking temperature is in the range of about 600–750° C.; the cooling rate between the baking temperatures and cooling down to about 400° C. is about 10–200° C./h; and the oxygen partial pressure is about 1–100% or 1–21%, balanced by $N_2$ or Ar.

In at least some embodiments, the oxide superconductor article is a long length material. It can be a tape or wire greater than 1 meter in length, or greater than 100 m or greater than 500 m in length. The process advantageously improves the electrical transport properties of the long length article to a greater extent than a short length (e.g., 10 cm), similarly processed.

As is used herein, "about" means ±10% of the recited value.

"Final phase converting heat treatment" is a heat treatment that converts precursor materials into the final, desired oxide superconductor. It is performed on an article that already possesses a significant degree of texture, e.g., a texture factor of at least 0.7, and which may already contain some final oxide superconductor. In some instances, the precursor includes a significant amount, e.g., more than 50 vol %, of the final oxide superconductor. The heat treatment converts the remaining precursor into oxide superconductor, cures cracks or other defects and oxygenates the oxide superconductor phase.

"Liquid sintering" means the conditions (temperature, oxygen partial pressure, time, etc.) to form a small amount of liquid (5–20 vol %) during heat treatment, followed by conditions that favor reformation of the oxide superconductor.

BRIEF DESCRIPTION OF THE DRAWING

The invention is described with reference to the following Figures, which are presented for the purpose of illustration only and which are not limiting of the invention, and in which.

DESCRIPTION OF THE PREFERRED EMBODIMENTS

Figure 1:
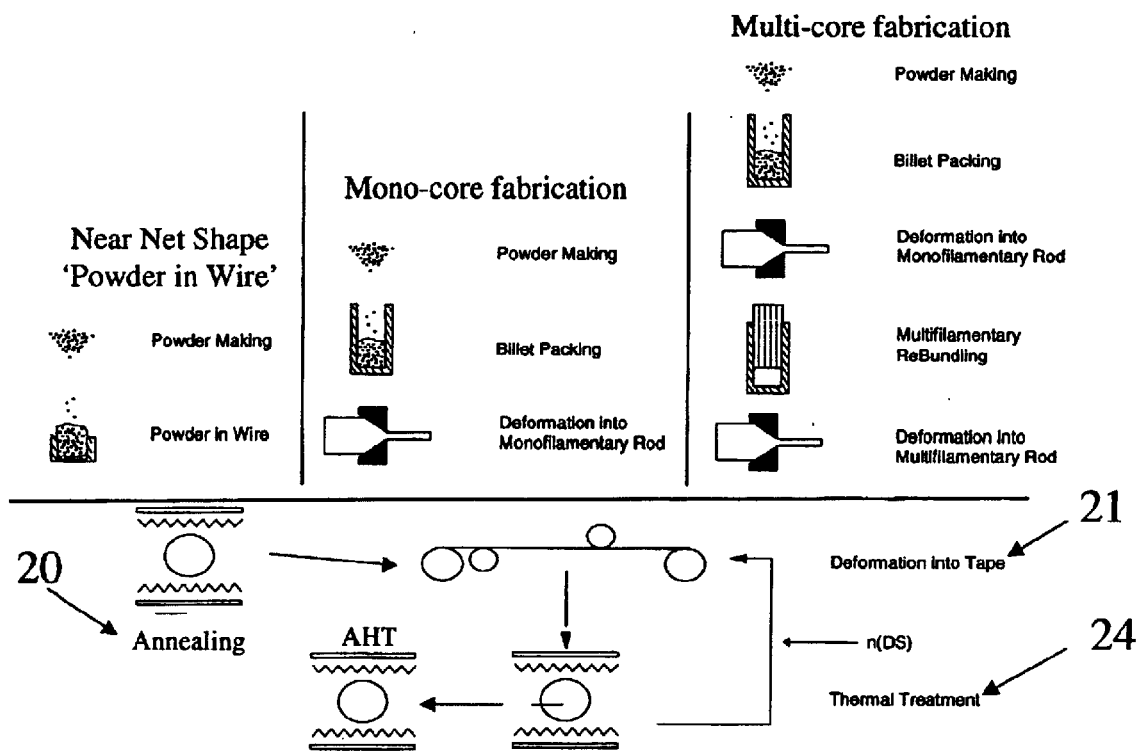
FIG. 1 is a processing profile for obtaining highly textured articles.

The causes of lead-rich phase and secondary phase formation at the grain boundary and inter-growth phase formation are complex. Normally, 2223 phase is not stable at low temperatures, i.e. 2223 phase is only stable in a certain temperature region, e.g., 800–850° C. under an oxygen partial pressure of about 1–21% balanced by $N_2$ or Ar. Once the 2223 phase forms, the remaining secondary phases are separated by the 2223 phase and further conversion of these remaining secondary phases ceases. The lead solubility in the 2223 phase is reduced during cooling, and the lead-rich phases are more stable than the 2223 phase at lower temperatures resulting in formation of secondary lead-containing phases upon cooling. In addition, very slow cooling will lead to 2223 phase decomposition, reduced phase purity and grain connectivity. While rapid cooling may limit the amount of 2223 phase decomposition, the cooling rate is limited by furnace capability and the desire to avoid thermal shock to the material. Furthermore, the matrix (or sheath) structure and material limit oxygen diffusion in long lengths, which has a tendency to delay lead-rich phases formation. Slow phase formation can be an indicator of slow diffusion of lead rich phases. Thus, it is more difficult for these phases to diffuse to porous regions at lower temperatures.

The present invention provides a method that allows secondary phase formation and decomposition, i.e. some elements diffuse in and out of the 2223 phase and reduce the remaining secondary phase inside the oxides grains or at grain boundaries.

The method of the invention may be used for the processing of both monocore and multifilamentary composites. It can be used for long lengths, e.g., greater than 1 meter, greater than 50 meter, greater than 100 meter or greater than 500 meter. The oxide superconductor used in the preparation of the mono- or multifilamentary article is a member of the bismuth-strontium-calcium-copper-oxide family (BSCCO) of superconductors. The bismuth is partially substituted by dopants, such as lead. In at least some embodiments, the oxide superconductor is $(Bi,Pb)_{2.1}Sr_2Ca_2Cu_3O_x$, where x is selected to provide superconductivity at temperatures above 77K. In at least some embodiments, the final oxide superconductor is BSCCO 2223 and the oxide precursor includes BSCCO 2212 and additional secondary phases, e.g., BSCCO 0011, necessary to provide the proper overall stoichiometry for BSCCO 2223.

A mono- or multifilamentary oxide precursor may be made by any conventional method. For example, an oxide powder in tube (OPIT) method may be used according to the general description given by Sandhage et al. (supra) in which precursor compounds, such as oxides, salts or metallorganic compounds, are loaded into a metallic tube and sealed, and thereafter subjected to a heat treatment to obtain a precursor oxide, such as BSCCO 2212, plus BSCCO 0011. Alternatively, the precursor compounds may be pre-reacted and/or premixed to form BSCCO 2212 and secondary phases prior to loading into the metallic tube.

Alternatively, a metallic powder in tube (MPIT) process may be used in which metal or alloy powders are used to form the BSCCO 2212 precursor. See, Otto et al., *JOM*, 45(9):48 (September 1993), for further details. The metal sources are added in proportions substantially stoichiometric for the final oxide superconductor. Additional noble metal may be added on the order of 0–70 wt %. Further detail on the processing of multifilamentary oxide superconductor composites may be found in International Application No. WO 99/07004 entitled "Fine Uniform Filament Superconductor," the contents of which are hereby incorporated by reference.

The tube is then extruded into a wire of smaller dimension. In the case of a multifilamentary wire, a hexagonal cross-section is preferred due to its efficient stacking ability, and the extruded wire is then repacked into another metallic tube and extruded again to obtain a multifilamentary of reduced cross-section. The process of re-packing and extruding the multifilamentary wire is carried out until the desired number of filaments is attained and at least one dimension of each filament has obtained the desired dimension (typically a function of the oxide grain length). Alignment of the superconducting oxide grains has been observed in long, thin filaments constrained within a metal matrix. In one embodiment, the oxide filament is of a dimension on the order of the longest dimension of the oxide superconductor grain. See, International Application No. WO 92/18989, entitled "A Method of Producing Textured Superconducting Oxide Bodies by the Oxidation/Annealing of Thin Metallic Precursors," the contents of which are incorporated by reference.

BSCCO 2212 may be prepared having either an orthorhombic or tetragonal solid state lattice symmetry. In preferred embodiments, it may be desirable to use the tetragonal phase of the BSCCO 2212 oxide superconductor in the formation of the multifilamentary wire, because it has been observed previously that tetragonal BSCCO 2212 performs well in wire forming operations. This may be because the tetragonal phase, having identical a and b axes, responds better to more symmetric deformations and/or because the packing density of the tetragonal phase of BSCCO 2212 is greater than the corresponding orthorhombic phase. The tetragonal phase therefore packs well into the metallic tubes used in the OPIT process to form homogeneously packed powders which can be further densified upon extrusion or drawing. The orthorhombic phase of BSCCO 2212, on the other hand, undergoes densification or texturing to a much greater extent than the corresponding tetragonal phase, resulting in a denser, less porous oxide grains structure when subjected to asymmetric deformation operations. Thus, in preferred embodiments, a filamentary wire is formed using tetragonal phase BSCCO 2212, which is phase converted into orthogonal phase BSCCO 2212 prior to texturing. See, U.S. Pat. No. 5,942,466, entitled "Processing of (Bi,Pb) SCCO Superconductors in Wires and Tapes," the contents of which are incorporated by reference, for further details.

According to the method of the invention, a multifilamentary article containing the precursor to an oxide superconductor is processed to obtain a highly textured grain structure. The precursor to the oxide superconductor is selected for its ability to be oriented or textured. BSCCO 2212 in particular may be textured using a variety of techniques. For example, texture may be introduced by reaction conditions and/or deformation. In reaction-induced texture (RIT), processing conditions are chosen which kinetically favor the anisotropic growth of the oxide grains. Reaction-induced texture can occur in a solid phase system or, preferably, in a solid-plus-liquid phase system. BSCCO 2212 undergoes a reversible melt at elevated temperatures, which is well-suited for RIT. The presence of a liquid greatly increases the kinetics of anisotropic grain growth, probably through increased rates of diffusion of the oxide components. Deformation-induced texture (DIT) occurs by applying a strain to the oxide grains to induce alignment of the oxide grains in the plane or direction of elongation. Deformation-induced texture requires anisotropic grains in order to effect a preferential alignment of the grains. Orthorhombic BSCCO 2212 is the preferred oxide precursor for deformation-induced texturing.

FIG. 1 illustrates a processing profile for a method of the invention used to obtain highly textured articles. In the first step, an oxide superconductor precursor is subjected to one or more anneal and deformation iterations, denoted by step 20 and step 21, respectively. The anneal 20 serves two purposes. Firstly, it serves to form the precursor oxide orthorhombic BSCCO 2212 which is to be textured (in those instances where it has not already been formed). Secondly, it is also possible to adjust the processing conditions to promote partial melting during the anneal, indicated by step 24 to assist in grain growth and enhance reaction-induced texture. An anneal in the range of 800–860° C. in 0.075 atm $O_2$ (total pressure 1 atm) is typical for partial melting to occur. The deformation 21 of the article promotes deformation induced texturing. Suitable texture-inducing deformations include asymmetric deformations, such as rolling and pressing. One or more anneal-deformation iterations may be performed.

In at least some embodiments, a high reduction rolling process is used to highly texture the multifilamentary article. A high reduction rolling operation has been shown to be highly effective in producing a high density, highly textured oxide phase. The single deformation step introduces a high level of deformation strain, e.g., 40–95%, and preferably >90% strain, by reducing the article thickness by 40–95% in a single step. The high reduction process completely distributes the deformation energy throughout the article. Thus, the entire filament experiences similar densifying and texturing forces, leading to greater filament uniformity and degree of texture. Such processing additionally has been found to eliminate undesirable non-uniformities along the length of the oxide filaments, while providing consistently better electrical transport properties in the final article, regardless of the particular method used to obtain the final oxide superconducting phase. As a further advantage, the process provides a densified and textured precursor oxide in a single anneal and deformation step, as compared to more traditional methods of precursor processing which involve multiple anneal and deformation steps. Further information on a single step deformation process may be found in U.S. Pat. No. 6,247,224, entitled "Simplified Deformation-Sintering Process for Oxide Superconducting Articles," which is hereby incorporated by reference.

The resultant precursor oxide is then highly textured and highly dense. In preferred embodiments, the highly textured precursor has an f-factor value of at least 0.7, more preferably at least 0.8 and most preferably at least 0.9. In the preferred processing methods described herein to obtain a highly textured oxide, f-factors on the order of 0.95 are attainable. In other preferred embodiments, the highly dense precursor is at least 70% dense relative to theoretical. Preferably, highly dense oxides possess a density that is greater than 80%, and most preferably greater than 90% dense, relative to theoretical (in which the material has no pore space or voids).

The highly textured and dense precursor is then heated under conditions that convert the precursor into the desired oxide superconductor. Phase conversion is contemplated to include conversion of a significant amount, e.g., about 80–95%, of the starting precursor into the final oxide superconductor. Phase conversion of BSCCO 2212 into BSCCO 2223 may be carried out over a wide processing range. Processing conditions include heating the article at a temperature of substantially in the range of 815° C. to 860° C. at a $P_{O2}$ substantially in the range of 0.001 to 1.0 atm. The exact processing temperature may vary dependant upon the oxygen partial pressure. In at least some embodiments, the oxygen partial pressure is in the range of 0.001–1.0 atm; and is preferably in the range of 0.01–0.25 atm, the balance being an inert gas such as $N_2$ or Ar.

In at least some embodiments, the heat-treated material after converting the BSCCO 2212 (plus secondary phases) precursor into BSCCO 2223 by ~80–95% optionally is rolled again to reduce the thickness by about 10%. This is a low strain deformation, but is sufficient to eliminate the initial tape expansion due to the heat treatment.

The oxide superconductor is further processed under conditions that sinter the oxide at a partially melting temperature such that the liquid co-exists with the final oxide superconductor and bake at two lower temperatures, in which (a) a liquid phase is formed such that the liquid phase co-exists with the final oxide superconductor; (b) the liquid phase is transformed into the final oxide superconductor; (c) secondary phases convert to 2223 phase; and (d) lead-rich phases form and diffuse into porous part of the material. This process is referred to as liquid phase sintering.

The above process has been found to advantageously heal any cracks or defects that may have been introduced into the oxide superconductor filaments, particularly during any deformation operation. The liquid is believed to wet the surfaces of cracks located within and at the surfaces of the oxide grains. Once the conditions are adjusted to transform the liquid into the final oxide superconductor, oxide superconductor is formed at the defect site and heals the defect. In the BSCCO system, a temperature in the range of about 815–860° C. may be used as liquid phase sintering at a $P_{O2}$ in the range of about 0.001–1.0 atm. In at least some embodiments, conditions of 820–835° C. at 0.075 atm $O_2$ are sufficient. A further heating processing is then applied to the article under conditions where the liquid is consumed and the final oxide superconductor is formed from the melt. In general, a temperature in the range of about 750–830° C. may be used at a $P_{O2}$ in the range of about 0.01–1.0 atm. In at least some embodiments, conditions of 820–780° C. at 0.075 atm $O_2$ are sufficient. See, U.S. Pat. No. 5,635,456 entitled "Processing for Bi/Sr/Ca/Cu/O-2223 Superconductors," which is hereby incorporated by reference, for further details.

A subsequent baking processing is then applied to the article under conditions resulting in lead-rich secondary phase formation and diffusion into porous regions of the article whereby oxygen starts doping into the 2223 grains. This heat treatment is conducted at a temperature of 500 to 800° C. at an oxygen partial pressure of 0.03 to 1.0 atm. In at least some embodiments, the heat treatment includes heating at a temperature in the range of 650–700 ° C. at an oxygen partial pressure of about 0.075–1.0 atm. See States Pat. No. 5,798,318, which is hereby incorporated by reference.

The resultant superconducting article has high phase purity (>90% oxide superconductor), however, significant lead-rich phases remain at the grain boundaries of the oxide superconductor. The additional heat treatment of the invention increases oxide superconductor phase purity by converting secondary phases within the oxide grains into BSCCO 2223 and enhances diffusion of the lead-rich phases and other secondary phases away from the grain boundaries.

Figure 2:
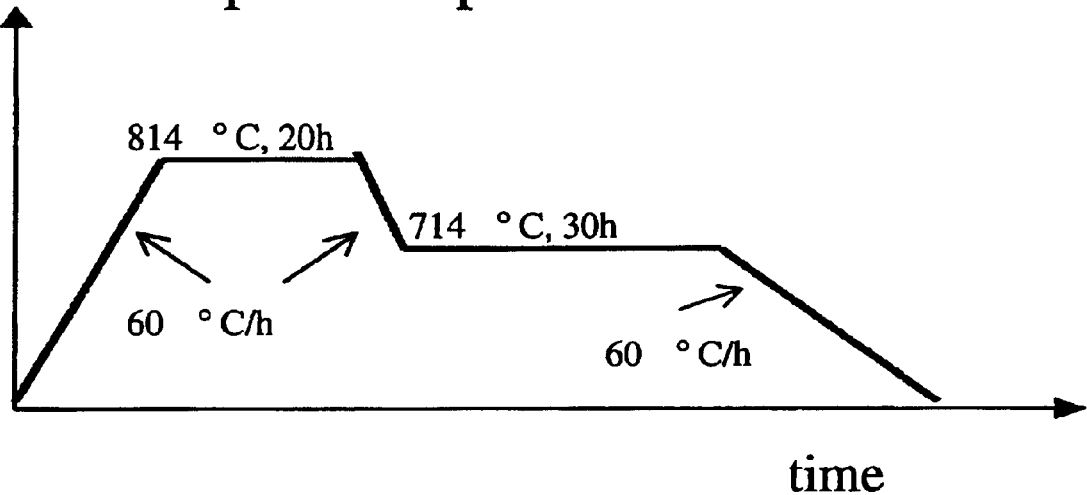
FIG. 2 is temperature vs. time curve used in the additional heat treatment (AHT) of the invention.

A general processing profile for the additional heat treatment is shown in FIG. 2. After the final phase converting heat treatment and cooling down below about 400–600° C., the article is heated up to temperatures in the range of 500–830° C. under conditions selected to decompose remaining secondary phases at the oxide superconducting grain boundary or within the oxide superconductor grain and to convert the secondary phases into the BSCCO 2223 oxide superconducting phase. In at least some embodiment, the heat treatment includes a first baking temperature of about 750–830° C. for up to about 20 h, followed by cooling at about 1–100° C./h to a second baking temperature of about 600–750° C. After baking for about 5–40 h, the sample is cooled to below about 400° C. at a cooling rate of 10–20° C./h. More generally, the dwells times at the baking temperatures can be up to about 60 h in duration. In at least some embodiments, the oxygen partial pressure is in the range of about 0.01–1.0 atm, or about 0.03–1.0 atm, or about 0.075–0.25 atm $O_2$. Controlled cooling is used to avoid conditions during cooling that favor the decomposition of BSCCO 2223 and reformation of secondary phases. In at least some embodiments, the cooling rate is sufficiently great so that there is no significant dwell time in a temperature and oxygen partial pressure regime that favors BSCCO 2223 decomposition.

The wires exhibit good electrical transport properties, as is demonstrated in the Examples. The invention is described in the following examples, which are presented for the purpose of illustration and which are not limiting of the invention, the full scope of which is set forth in the claims.

EXAMPLE 1.

This example compares the transport performance of multifilamentary oxide superconductor tapes prepared using the conventional method and the additional heat treatment in accordance with the present invention.

A precursor filament was prepared by filling a silver tube with precursor powders including tetragonal BSCCO 2212 and BSCCO 0011, necessary to provide a precursor having the appropriate stoichiometry of the produce oxide superconductor BSCCO 2223. The powder-in-tube was drawn to a wire of smaller dimensions; and then a plurality of wires were bundled and redrawn to provide a multifilamentary wire having 55-filaments. Typically, such multifilamentary wires have a dimension of 0.054" (54 mil). The precursor oxide was heat treated to convert tetragonal phase BSCCO 2212 into orthorhombic phase BSCCO 2212. Lastly, the precursor was densified and textured in a single large reduction rolling operation, which resulted in a multifilamentary tape having a thickness of 9.05 mil. Typically, large reduction rolling operations on this scale produce oxide precursor tapes having about 90% density.

The BSCCO 2223 precursor tape was heated at a ramp rate of 10□C./min to the reaction temperature of 822° C. for 20 h under an oxygen partial pressure of 0.075 atm to convert 2212 and secondary phases to more than 80% of 2223 phase, as identified by X-ray diffraction.

The tape was rolled by 10% reduction to reach a high density again (~90% of theoretical density) followed by a phase converting heat treatment as follows: (a) 827° C. (40 h); (b) 814° C. (40 h); and (c) 714° C. (30 h), all at 0.075 atm, which is effective to complete conversion of the precursor oxide into BSCCO, diffuse lead-rich phase to porous regions of the oxide superconductor phase to some extent, reduce lead content in 2223 grain and dope oxygen into 2223 grain. The tape was treated in a length of 800 m.

Several tapes made by the condition described above were cut into 10 cm in length and the additional heat treatment (AHT) was applied to the tapes by heating up using 60° C./h to 814° C. with a dwell of 20 h and cooling to 714° C. with a dwell of 30 h, followed by cooling at 60° C./h to below 400° C., all at 0.075 atm. Tape critical current density was measured before and after the additional heat treatment to determine the extent of transport performance improvement. Tape critical current density at 77 K and self field before and after the additional heat treatment is reported in Table 1, along with % increase in Jc and % decrease in 3221 phase XRD intensity performed on Ag/superconductor interface.

TABLE 1

10 cm Long Tapes.

| Sample no. | Jc before AHT (kA/cm$^2$) 77 K, 0 T | Jc after AHT (kA/cm$^2$) 77 K, 0 T | Increase in Jc by AHT (%) | 3221 phase before AHT (%) | 3221 phase after AHT (%) | Jc before AHT (kA/cm$^2$) 77 K, 0.1 T | Jc after AHT (kA/cm$^2$) 77 K, 0.1 T |
|---|---|---|---|---|---|---|---|
| 1-1 | 38.8 | 47.5 | 22.4 | 5.95 | 1.6 | | |
| 1-2 | 36.4 | 45.4 | 24.7 | 7.7 | 1.75 | | |
| 1-3 | 40.6 | 47.8 | 17.7 | 4.65 | 1.1 | | |
| 1-4 | 36.7 | 45.6 | 24.3 | 4.95 | 1.54 | | |
| 1-5* | 39.1 | 44.2 | 13 | | | | |
| 1-6* | 41 | 46 | 12 | | | 17 | 19 |

The experiment was repeated on similar tapes with longer length (1 m) as described above. The results for Jc improvement after the AHT are reported in Table 2.

TABLE 2

1 m Long Tapes

| Sample no. | Jc before AHT (kA/cm$^2$) | Jc after AHT (kA/cm$^2$) | Increase in Jc by AHT (%) |
|---|---|---|---|
| 2-1 | 39.5 | 46.8 | 18.5 |
| 2-2 | 38.8 | 45 | 16 |
| 2-3 | 39 | 41.3 | 5.9 |
| 2-4 | 43.3 | 48.5 | 12 |

This series of examples demonstrates the benefit of the method of the invention on samples with longer length.

The procedure was repeated on several 55-filament tapes of similar composition but much longer length (~50 m) and processing similar to that described above. The results for Jc improvement after the AHT are reported in Table 3.

TABLE 3

50 m Long Tapes.

| Sample no. | Jc before AHT (kA/cm$^2$) | Jc after AHT (kA/cm$^2$) | Increase in Jc by AHT (%) |
|---|---|---|---|
| 3-1 | 42.5 | 45.4 | 6.8 |
| 3-2 | 40.8 | 47.7 | 16.9 |
| 3-3 | 41.5 | 46.1 | 11.1 |
| 3-4 | 37.8 | 42.9 | 13.5 |
| 3-5 | 38.5 | 41.6 | 8.1 |

The procedure was repeated on several 55-filament tapes of similar composition and processing to that described above, except using 30 C./h cooling after AHT baking. The results for Jc improvement after the AHT are reported in Table 4.

TABLE 4

50 m Long Tapes, cooled at 30C. °/h.

| Sample no. | Jc before AHT (kA/cm$^2$) | Jc after AHT (kA/cm$^2$) | Increase in Jc by AHT (%) |
|---|---|---|---|
| 4-1 | 44.0 | 46.1 | 47.0 |
| 4-2 | 39.6 | 46.4 | 46.3 |
| 4-3 | 41.6 | 45.1 | 46.2 |
| 4-4 | 37.1 | 41.7 | 42.2 |

In summary, after AHT samples demonstrated higher Jc, e.g., in the range of 5–30%, no matter of material length during the AHT. These improvements indicate that the grain connectivity is enhanced probably by reducing lead-rich and other secondary phases at grain boundary. By TEM, SQUID and Transmission-XRD analysis, it has been found that the 2212 intergrowth is reduced significantly, which provides high purity conduct and improves the transport property, Jc.

EXAMPLE 2

This example investigates the effectiveness of the AHT on a tape having in the final heat treatment using 10 cm instead of 800 m in length. The results for Jc improvement after the AHT are reported in Table 5.

TABLE 5

| Sample no. | Jc before AHT (kA/cm$^2$) | Jc after AHT (kA/cm$^2$) | Increase in Jc by AHT (%) |
|---|---|---|---|
| 5-1 | 43.4 | 44.0 | 1.5 |
| 5-2 | 44.6 | 44.7 | 0.2 |
| 5-3 | 39.5 | 40.0 | 1.3 |
| 5-5 | 41.1 | 42.2 | 2.7 |

As in Example 1, samples after AHT demonstrated higher increases in tape Jc, e.g. in the range of 5–30%. In contrast, however, samples in the example 2 having a short length for the final heat treatment showed a moderate increase in tape Jc ranging from 0–2%. The smaller improvement of Jc in these samples may be due to faster oxygen diffusion by diffusing through tape end and large amount of lead-rich phase formation at higher temperature. These differences were reflected in the AHT is more useful for treating long length material.

EXAMPLE 3

This example compares the AHT process of the invention on fully final heat-treated tape (including sintering at liquid-phase temperature followed by two baking stages with AHT on tape with only liquid-phase sintering process. The results for Jc improvement after the AHT are reported in Table 6.

TABLE 6

| Sample no. | FHT Condition | Jc before AHT (kA/cm$^2$) | Jc after AHT (kA/cm$^2$) |
|---|---|---|---|
| 6-1 | Only liquid sintering | | 34.4 |
| 6-2 | Full FHT | 35.4 | 36.8 |

The above example shows the complete final heat treatment is very useful before AHT process.

Another experiment was done on a 55-filament short tape of similar composition and processing a final heat treatment as that described above, except of longer baking time at 814 C. for 60 h (instead of 40 h) and at 714 C. for 60 h (instead of 30 h). The results for Jc improvement after the FHT are reported in Table 7.

TABLE 7

| Sample no. | Jc FHT normal (kA/cm$^2$) | Jc FHT using longer baking time (kA/cm$^2$) | Jc after AHT (kA/cm$^2$) |
|---|---|---|---|
| 7-1 | | 34.9 | |
| 7-2 | 35.4 | | 36.8 |

This experiment demonstrates that the AHT process could not be replaced by using longer FHT baking time.

What is claimed is:

1. A method of making a (Bi,Pb)$_2$Sr$_2$Ca$_2$Cu$_3$O$_x$ (BSCCO 2223) oxide superconductor article, comprising:
   converting a textured oxide superconducting precursor into a BSCCO 2223 oxide superconductor, wherein at least 80 vol % of the oxide superconductor precursor is converted into BSCCO 2223;
   liquid phase sintering of the BSCCO 2223 oxide superconductor wherein the sintering step comprises the steps of:
   (a) heating at a first temperature, and
   (b) annealing the BSCCO 2223 oxide superconductor at a temperature less than the first temperature;
   cooling the oxide superconductor article to less than or equal to 600° C.; and
   subjecting the oxide superconductor article to an additional heat treatment at a temperature in the range of about 600° C. to about 830° C. under conditions selected to decompose remaining secondary phases at the oxide superconducting grain boundary or within the oxide superconductor grain and to convert the secondary phases into the BSCCO 2223 oxide superconducting phase.

2. The method of claim 1, wherein the step of liquid phase sintering at a first temperature, followed by annealing at a temperature less than the first temperature is conducted in an oxygen partial pressure in the range of about 0.01 to 0.21 atm balanced by N$_2$ or Ar.

3. The method of claim 2, wherein liquid sintering is conducted at a temperature in the range of about 810° C. to about 850° C.

4. The method of claim 2, wherein the annealing step further comprises a second annealing step, wherein the temperature of the second annealing step is at a temperature less than the first annealing step.

5. The method of claim 3, wherein the annealing step comprises a first annealing step at a temperature in the range of about 750° C. to about 830° C., followed by a second annealing step at a temperature in the range of about 600° C. to about 750° C.

6. The method of claim 1, wherein the cooling step is performed at a rate of about 10–100° C./h.

7. The method of claim 1, wherein the cooling step is performed by cooling the oxide superconducting article to a temperature below 400° C.

8. The method of claim 2, wherein the critical current density of the article is 5% greater after the additional heat treatment than after the liquid phase sintering step.

9. The method of claim 1, wherein the additional heat treatment comprises a two-step process, wherein the first baking temperature is in the range of about 750–830° C. and the second baking temperature is in the range of about 600–750° C. and the oxygen partial pressure is about 0.01 to 1.0 atm balanced by N$_2$ or Ar.

10. The method of claim 1, wherein the additional heat treatment comprises heating to a liquid sintering temperature, followed by heating at at least one temperature less than the liquid sintering temperature.

11. The method of claim 10, wherein the additional heat treatment includes heating at two different temperatures less than the liquid sintering temperature.

12. The method of claim 1, further comprising controlled cooling of the article after additional heat treatment to less than 600° C.

13. The method of claim 12, wherein controlled cooling is selected to avoid decomposition of the BSCCO phase and/or reformation of secondary phases.

14. The method of claim 12, wherein the cooling rate is about 10–200° C./h.

15. The method of claim 1, wherein the oxide superconductor precursor comprises BSCCO 2212 and secondary phases to provide composition for BSCCO 2223.

16. The method of claim 1, wherein the oxide superconductor precursor is textured by rolling deformation.

17. The method of claim 16, wherein the rolling deformation provides a deformation strain of 40 to 95%.

18. The method of claim 1, wherein the textured oxide superconductor precursor has a texture factor of at least 0.7.

19. The method of claim 1, wherein the step of converting the oxide superconductor precursor converts 80 to 95% of the precursor into the BSCCO 2223 oxide superconductor.

20. The method of claim 1, wherein the BSCCO 2223 oxide superconductor article has a length of at least 1 meter.

21. A method of making a (Bi,Pb)$_2$Sr$_2$Ca$_2$Cu$_3$O$_x$ (BSCCO 2223) oxide superconductor article, comprising:
   texturing an oxide superconductor precursor to obtain a textured oxide superconconductor precursor;
   heating the textured oxide superconducting precursor to convert a portion of the oxide superconductor precursor into the BSCCO 2223 oxide superconductor;
   rolling the converted oxide superconductor article at a strain of less than or equal to 10% to redensify the oxide superconductor article
   heating the redensified oxide superconductor article to convert the remaining oxide superconductor precursor into the BSCCO 2223 oxide superconductor by liquid phase sintering at a first temperature, followed by annealing at a temperature less than the first temperature, in an oxygen partial pressure in the range of about 0.01 to 0.21 atm balanced by N$_2$ or Ar;
   cooling the oxide superconductor article to less than or equal to 600° C.; and
   subjecting the oxide superconductor article to an additional heat treatment at a temperature in the range of about 600° C. to about 830° C. under conditions selected to decompose remaining secondary phases at the oxide superconducting grain boundary or within the oxide superconductor grain and to convert the secondary phases into the BSCCO 2223 oxide superconducting phase.

* * * * *